United States Patent [19]

Miyamoto

[11] E Re. 30,781

[45] Reissued Oct. 20, 1981

[54] LOGARITHMIC AMPLIFIER

[75] Inventor: Yukihiko Miyamoto, Tokyo, Japan

[73] Assignee: Trio Kabushiki Kaisha, Tokyo, Japan

[21] Appl. No.: 178,457

[22] Filed: Aug. 15, 1980

Related U.S. Patent Documents

Reissue of:

[64] Patent No.: 4,209,714
Issued: Jun. 24, 1980
Appl. No.: 806,098
Filed: Jun. 13, 1977

[30] Foreign Application Priority Data

Jun. 14, 1976 [JP] Japan ..... 51-69605

[51] Int. Cl.[3] ..... H03K 5/08; G06G 7/12

[52] U.S. Cl. ..... 307/490; 307/492; 307/540; 328/145

[58] Field of Search ..... 307/229, 230, 237; 328/144, 145; 330/149; 364/357

[56] References Cited

U.S. PATENT DOCUMENTS

| | | | |
|---|---|---|---|
| 3,373,294 | 3/1968 | Fuijinami | 328/145 |
| 3,374,361 | 3/1968 | Callis | 328/145 |
| 3,388,266 | 6/1968 | Kjar | 307/237 |
| 3,614,644 | 10/1971 | Lieberman | 330/149 |

OTHER PUBLICATIONS

I.B.M. Tech. Disc. Blltn., Videologarithmic Amplifier, F. L. O'Malley, vol. 13, No. 9, 2/71, p. 2610.

*Primary Examiner*—Stanley D. Miller, Jr.
*Assistant Examiner*—B. P. Davis
*Attorney, Agent, or Firm*—Lane, Aitken, Ziems, Kice & Kananen

[57] ABSTRACT

A logarithmic amplifier comprising a common-emitter type transistor amplifier circuit with an emitter resistor and a collector load. A bias voltage is applied to the base of the transistor through a diode so that the overall input-output transfer characteristic of the amplifier exhibits a logarithmic characteristic for a relatively wide range of input signals. A cascade connection of several of the basic amplifier circuits enlarges the dynamic range over which a logarithmic transfer characteristic is achieved.

5 Claims, 4 Drawing Figures

LOGARITHMIC AMPLIFIER

Matter enclosed in heavy brackets [ ] appears in the original patent but forms no part of this reissue specification; matter printed in italics indicates the additions made by reissue.

BACKGROUND OF THE INVENTION

This invention relates to logarithmic amplifiers providing a logarithmic type transfer function for the input signal of the output signal over a wide dynamic range of input signals.

In conventional FM receivers, rectified signals derived from the 10.7 Mhz intermediate frequency signal are typically used to provide the gate trigger voltages for the signal strength meter, the stereo signal indicator, the muting circuit and the like. However, because the strength of the intermediate frequency signal is proportional to the electric field strength of the incoming received signal at the receiving antenna, and the voltage change necessary to change the triggering state is small in a narrow trigger region such as used in those circuits, it is important to have a logarithmic or similar amplifier which functions over a wide dynamic range of input signals. Furthermore, the range of adjustment for stereo sensitivity for stereo-monoral change-over and for the operating sensitivity of a muting circuit, both using a signal derived from the intermediate frequency signal, is narrow. For this reason, when the stereo sensitivity and the muting sensitivity are different, it is not feasible to use a single gate signal for both circuits.

As a result, various circuits have been proposed to overcome or avoid these problems. However, none of the prior art techniques have produced entirely satisfactory results. Prior art approaches have attempted to develop logarithmic amplifiers to enlarge the dynamic range over which a logarithmic transfer characteristic is achieved. One such amplifier uses a pair of diodes connected in antiparallel fashion in the feedback loop of a negative feedback amplifier. Another uses an automatic gain control amplifier circuit having its operating point and the saturation level appropriately adjusted to produce a logarithmic transfer characteristic for input to output signals. These amplifiers, however, can at most approximate a logarithmic transfer characteristic for a 40 to 60 dB signal range. The logarithmic approximation range of the first amplifier, for example, is 40 to 60 dB. The second described amplifier, on the other hand, has a simpler circuit construction, but its logarithmic approximation range is narrower.

SUMMARY OF THE INVENTION

Accordingly, a primary object of the present invention is to provide a logarithmic amplifier having a relatively large dynamic range over which a logarithmic transfer characteristic is achieved.

According to the present invention a logarithmic amplifier is provided using a basic common-emitter type transistor amplifier circuit with an emitter resistor and a collector load. A bias voltage is applied to the base of the transistor through a diode so that the overall input-output transfer characteristic of the amplifier exhibits a logarithmic characteristic for a relatively wide dynamic range of input signals.

A cascade connection of several of the basic amplifier circuits enlarges the dynamic range over which a logarithmic transfer characteristic is achieved.

Other objects and features of the invention will be apparent from the following description taken in connection with the accompanying drawings.

DESCRIPTION OF THE PREFERRED EMBODIMENT

Figure 1:
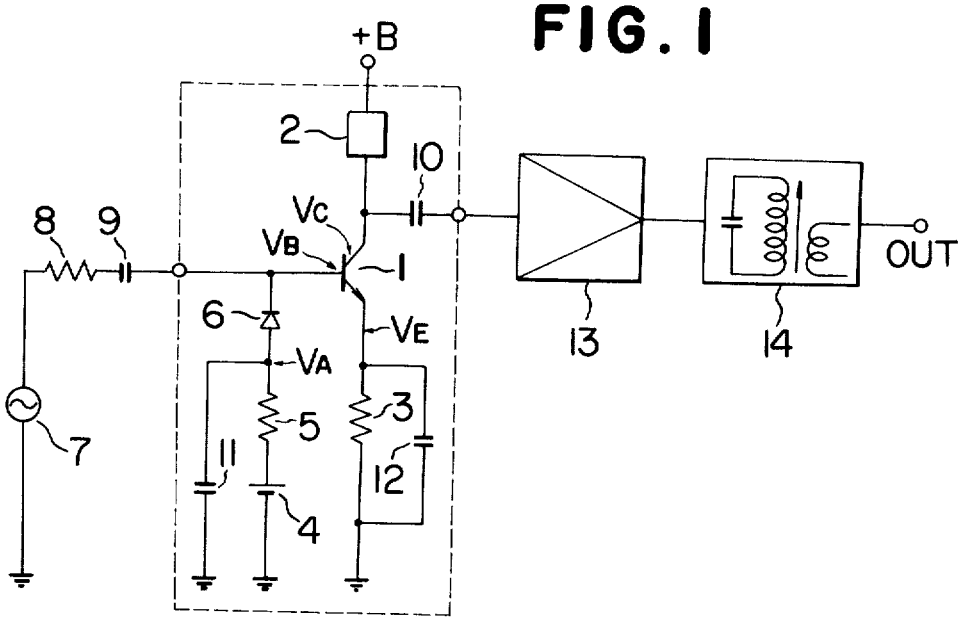
FIG. 1 is a schematic circuit diagram of a preferred embodiment of a logarithmic amplifier according to the present invention.

FIG. 1 shows an embodiment of the logarithmic amplifier according to the present invention in which an amplifying transistor 1 has its collector connected to a power source +B through a collector load 2. The emitter of the transistor 1 is connected to ground through a resistor 3 to provide a current feedback path. The basic amplifier circuit of the type described thus far is well known as a common-emitter type amplifier. A base bias voltage is applied from a bias source 4 through a resistor 5 and a diode 6 to the base of the transistor 1. An input signal source 7 is connected to the base of the transistor 1 through a signal source impedance 8 and a coupling capacitor 9. A capacitor 11 is connected across the resistor 5 and the bias source 4. Another capacitor 12 is connected across the emitter resistor 3. Capacitors 11 and 12 function as by-pass capacitors. The collector of transistor 1 is also connected to one terminal of a coupling capacitor 10, the other terminal of which is connected to a resonant circuit 14 through an amplifier circuit 13.

With this circuit arrangement, when a large input signal is applied to the amplifier circuit, the base-emitter junction of the transistor 1 and the diode 6 in the bias circuit cooperate to provide, in effect, double voltage rectification in the input circuit. Also, as shown in FIG. 3(C), when the amplitude of the input signal is large, the portions of the input signal having either positive or negative amplitudes extending beyond the zero output $V_E$–$V_A$ range on the X axis in FIG. 3(C) are rectified. In FIG. 3(C) the curve to the right of the vertical line in the first and fourth quadrants of the graph represents the current versus input characteristic of the base-emitter junction of the transistor 1 in the positive input signal rectification region. Similarly, the curve to the left of the vertical line in the second and third quadrants of the graph represents the characteristic of the diode 6 for the negative input signal rectification region. In other words, rectification of the positive side of the input signal is restricted by the base-emitter junction and the negative side by the diode 6. Thus, when a large input signal is provided at the input, rectification causes the base current of the transistor 1 to increase as compared to the case when no input signal is applied. In such an instance, the collector current also increases, thereby causing the emitter voltage $V_E$ to rise due to the increased voltage drop across the resistor 3. It is therefore seen that when a large input signal is provided, the emitter voltage $V_E$ becomes larger than the voltage $V_A$ as measured at the connection point between the diode 6 and the resistor 5. This effect is indicated by the dotted lines on the graph in FIG. 2. Of course, the base voltage $V_B$ also changes with any change in the emitter voltage $V_E$. The effect of the changes is to shift the operating point of the amplifier circuit to the class C amplification mode when large signals are provided at the input. It is also noted that the average DC base voltage $V_B$ with a large input signal may be represented by the expression $(V_A+V_E)/2$. $(V_A+V_E)/2$ is also the expression for the base voltage $V_B$ when no input signal is provided.

Figure 2:
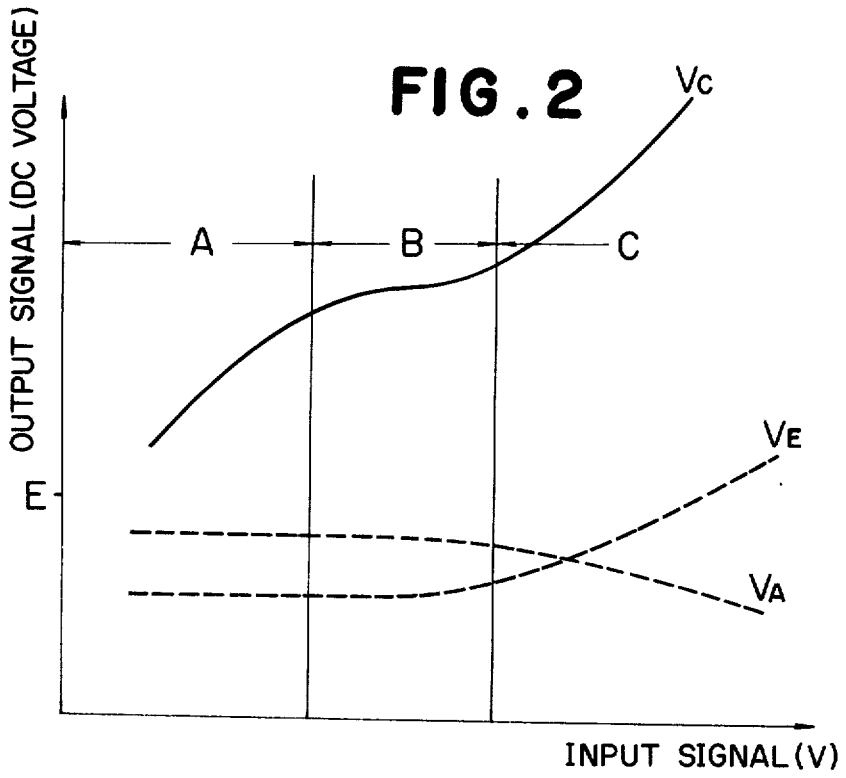
FIG. 2 is a graph illustrating the transfer characteristics of the amplifier of FIG. 1 for an input signal to an output signal and further illustrating voltage variations at selected points in the amplifier circuit of FIG. 1 as the amplifier input signal is increased.
Figure 3:
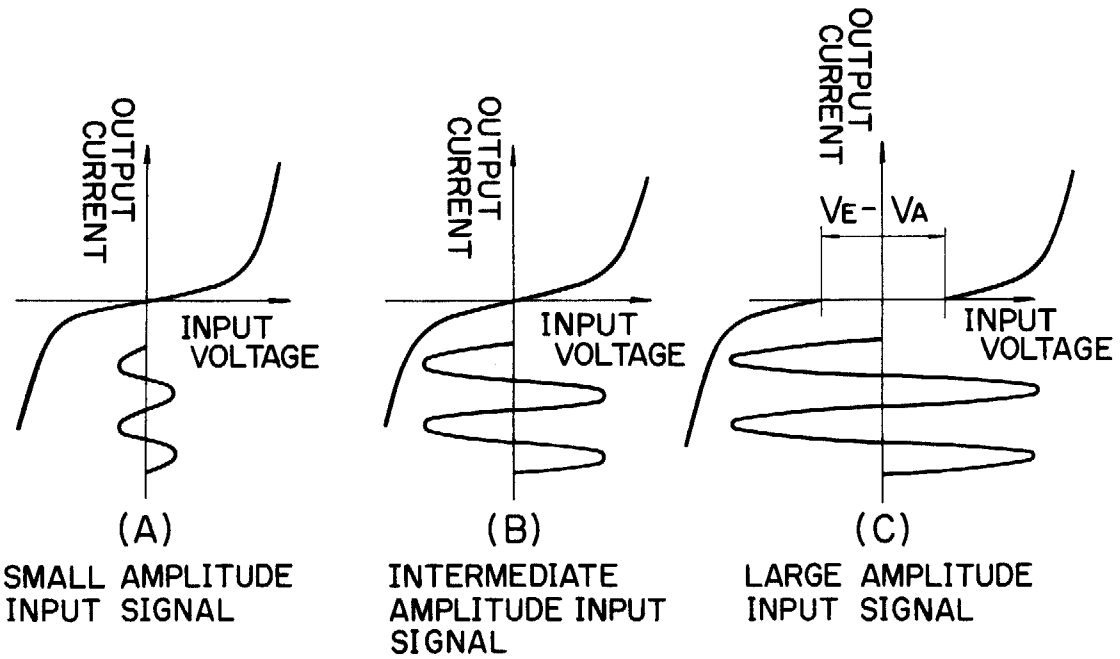
FIG. 3 includes several graphs illustrating the operating conditions of the input circuit portion of the amplifier circuit of FIG. 1 for small, medium and large input signal amplitudes.

The continuous line labelled $V_C$ in FIG. 2 shows the variation in the collector voltage $V_C$ of the transistor 1 corresponding to the amplifier output signal as the input signal provided by the signal source 7 is gradually increased. As shown in FIG. 2, the variation curve for the collector voltage $V_C$ corresponding to the output signal may be divided into three specific regions.

The first region of the variation curve corresponds to a small input signal range and is denoted by the letter A. In the A region, the input signal is sufficiently small and the non-linearities of the base-emitter junction (diode) of transistor 1 and the diode 6 are negligible in amplifying operation, and the amplifier operates substantially in class A mode. Correspondingly, the variation curve in the A region is substantially linear, as shown. The operating condition of the input circuit of the amplifier for the A region of operation is as shown in FIG. 3(A).

In the second or B region of operation as shown in FIG. 2 corresponding to intermediate amplitude input signals, the non-linearities of the diodes are effective to cause distortion of the input signal. However, true rectifying operation does not yet take place in the input circuit and there is no shift of the operating point of the transistor 1. The operating condition in the input circuit for the B region of operation is as shown in FIG. 3(B). Is should be noted that the variation of the collector voltage $V_C$ corresponding to the output signal for the B region exhibits a logarithmic curve. This results because the input signal is compressed by the non-linearities of the diodes. This logarithmic variation characteristic may also be explained by the fact that the effective amplifier input resistance is caused to decrease, depending on the input signal, and such decrease causes compression of the amplifier's output signal.

The third or C region of operation as shown in FIG. 2 corresponds to large amplitude input signals and the input signal is rectified as previously described, thereby causing the operating point of the amplifier to shift to the class C amplification mode. The rectification effect causes the operating point to shift with the amplitude of the input signal and, therefore, the average value of the effective amplifier input resistance (corresponding to a distortion factor) is little changed. As shown in FIG. 2 the variation in the collector voltage $V_C$ corresponding to the proportional to the variation of the input signal amplitude so that the output level of the amplifier is proportional to the input signal level. The operating condition of the input circuit for the C region of operation is as shown in FIG. 3(C). As previously described, the emitter voltage $V_E$ increases with an increase of the input signal while the voltage $V_A$ at the connection point between the resistor 5 and the diode 6 decreases, thereby increasing the difference $(V_E-V_A)$ between the emitter voltage $V_E$ and the connection point voltage $V_A$ as shown by the dotted lines in FIG. 2.

It is also noted that with operation in region B, the overall input-output transfer characteristic of the amplifier is logarithmic and the amplifier may be used as a logarithmic amplifier. The width of the B region, however, varies, depending on the signal source impedance 8 and the collector current of the transistor 1 corresponding to the no signal bias conditions. Experimental data indicates that the amplifier circuit is effectively operable as the logarithmic amplifier for an input signal dynamic range of 10 to 20 dB.

The output signal at the collector of transistor 1 is coupled by the capacitor 10 to the input of the conventional amplifier 13, the output of which is connected to resonant circuit 14 which is tuned to the frequency of the input signal, so that there is relatively little distortion of the final output signal provided at the terminal "OUT" in FIG. 1.

Although use of a conventional limiter circuit in the amplifier input circuit would be capable of producing similar characteristics as shown in FIG. 2 for operation in the region B, such a conventional circuit would not produce the characteristic shown in FIG. 2 for operation in the region C. More specifically, use of a conventional limiter circuit input circuit of an amplifier would not produce a linear characteristic for the input vs. output signal relation for an input signal in excess of the logarithmic variation range as does the logarithmic amplifier of the present invention.

Figure 4:
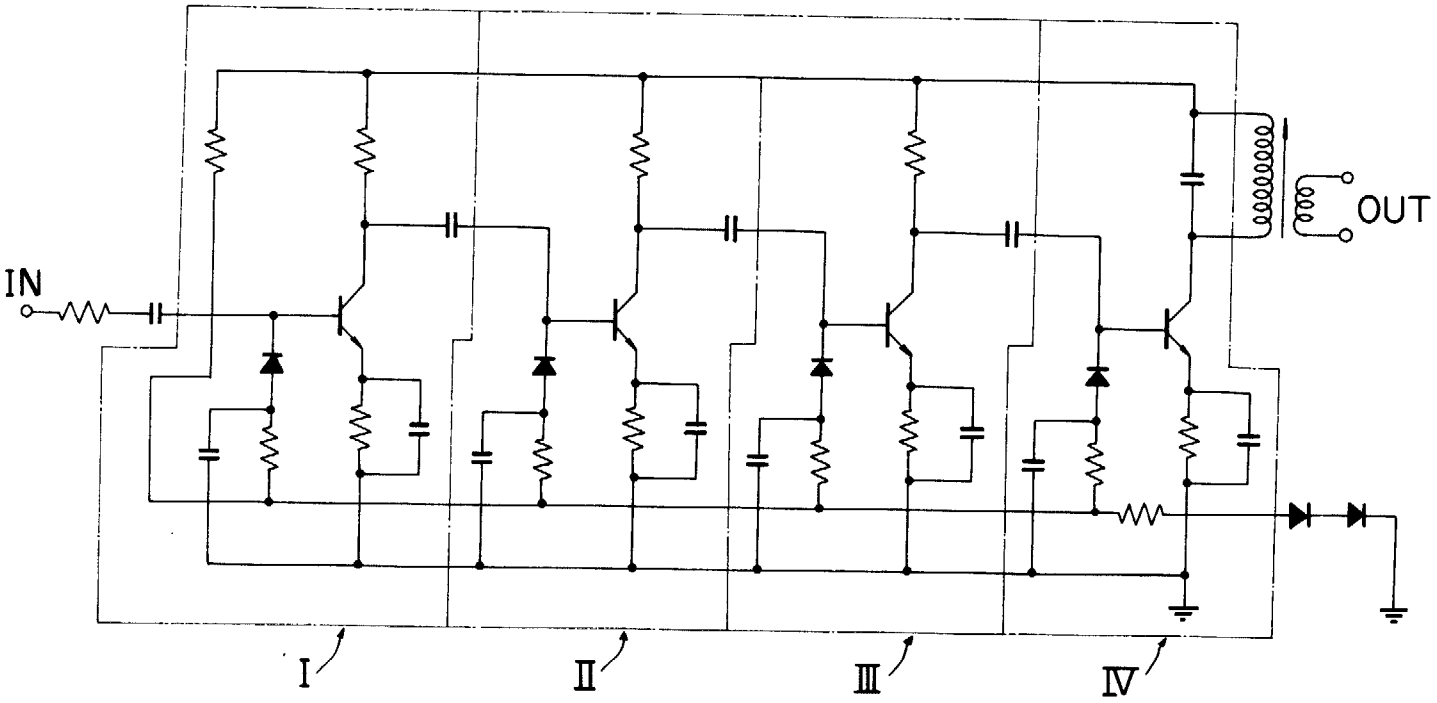
FIG. 4 is a schematic circuit diagram of a modification of the basic amplifier circuit of FIG. 1.

This feature of the present invention is useful in that it allows a plurality of the basic logarithmic amplifiers of FIG. 1 connected in cascade as shown in FIG. 4 to cause an enlargement of the effective dynamic range of the B region for the overall cascaded amplifier circuit. This can be achieved by adjusting the voltage gains for the respective cascaded amplifier stages so that, when the final state shifts from the B region to the C region, the preceeding stage shifts from the A region to the B region, and when the preceeding stage shifts from the B region to the C region, the further preceeding stage shifts from the A region to the B region. Experiments with the amplifier circuit shown in FIG. 4 which comprises a cascade connection of four of the basic amplifier circuits of FIG. 1, shown as stages I to IV in FIG. 4, indicates a good logarithmic input-output transfer characteristic can be obtained over an 80 dB dynamic range for the input signal.

Various other modifications of the disclosed embodiments will be apparent to a person skilled in the art without departing from the spirit and scope of the invention as defined by the appended claims.

What is claimed is:

1. A logarithmic amplifier circuit comprising at least one transistor connected in a common-emitter amplifier arrangement, said transistor having base, collector and emitter electrodes, said emitter electrode being connected to ground through a resistor, said collector electrode being connected to a power source through a load and providing an output signal, said base electrode being connected to a bias voltage source through a diode and to an input signal source, said diode and the base-emitter junction of the transistor cooperating to rectify the input signal from said signal source and comprising means to impart a logarithmic input-amplitude-level-to-output-amplitude-level transfer characteristic to the amplifier circuit for a predetermined amplitude range of input signals.

2. A logarithmic amplifier circuit according to claim 1, wherein the emitter electrode is connected to said bias source and to said signal source through said resistor.

3. A logarithmic amplifier circuit according to claim 2 wherein said transistor is an NPN type transistor and the cathode of said diode is connected to said base electrode and the anode of said diode is connected to said bias source.

4. A logarithmic amplifier circuit according to claim 3 further comprising a resistor connected between said diode and said bias source.

5. A logarithmic amplifier circuit comprising a plurality of amplifier stages connected in cascade, each stage including a transistor connected in a common-emitter stage including a transistor connected in a common-emitter amplifier arrangement and having base, collector and emitter electrodes, said emitter electrode being connected to ground through a resistor, said collector electrode being connected to a load, said base electrode being connected to a bias voltage source through a diode, the base electrode of the transistor of the first stage being connected to an input signal source and the collector electrode of the final stage providing an output signal, said diode and the base-emitter junction of the transistor of each stage cooperating to rectify the input signal from said signal source and comprising means to impart a logarithmic input-amplitude-level-to-output-amplitude-level characteristic to the logarithmic amplifier circuit for a predetermined amplitude range of input signals.

* * * * *